US009588209B2

(12) United States Patent
Priatna et al.

(10) Patent No.: US 9,588,209 B2
(45) Date of Patent: Mar. 7, 2017

(54) METHOD OF MULTISLICE MR ELASTOGRAPHY WITH MULTIBAND ACQUISITION

(71) Applicant: Siemens Medical Solutions USA, Inc., Malvern, PA (US)

(72) Inventors: Agus Priatna, Ballwin, MO (US); Dingxin Wang, Apple Valley, MN (US); Himanshu Bhat, Cambridge, MA (US)

(73) Assignee: Siemens Healthcare GmbH, Erlangen (DE)

( * ) Notice: Subject to any disclaimer, the term of this patent is extended or adjusted under 35 U.S.C. 154(b) by 519 days.

(21) Appl. No.: 14/256,004

(22) Filed: Apr. 18, 2014

(65) Prior Publication Data
US 2015/0301133 A1    Oct. 22, 2015

(51) Int. Cl.
*G01R 33/36* (2006.01)
*G01R 33/561* (2006.01)
*G01R 33/56* (2006.01)
*G01R 33/563* (2006.01)
*G01R 33/483* (2006.01)

(52) U.S. Cl.
CPC ... *G01R 33/56358* (2013.01); *G01R 33/4835* (2013.01)

(58) Field of Classification Search
CPC  G01R 33/36; G01R 33/3607; G01R 33/4835; G01R 33/5608; G01R 33/56341; G01R 33/56358; G01R 33/5676
USPC .......... 324/307, 309; 600/410, 413; 382/131
See application file for complete search history.

(56) References Cited

U.S. PATENT DOCUMENTS

| 2012/0269415 A1* | 10/2012 | Glaser | A61B 5/055 382/131 |
| 2014/0107467 A1* | 4/2014 | Felmlee | G01R 33/56358 600/411 |
| 2014/0114177 A1* | 4/2014 | Chen | A61B 5/0051 600/415 |

OTHER PUBLICATIONS

Larkman et al; "Use of Multicoil Arrays for Separation of Signal from Multiple Slices Simultaneously Excited"; Journal of Magnetic Resonance Imaging 13:313-317 (2001).
(Continued)

*Primary Examiner* — Melissa Koval
*Assistant Examiner* — Rishi Patel

(57) ABSTRACT

A method for performing multi-slice MR Elastography on an anatomical region of interest associated with a patient includes inducing shear waves at a shear wave frequency value (e.g., between 25-500 Hz) in the anatomical region of interest using an external driver. Next, the anatomical region of interest is imaged during a single patient breath-hold using an MRI acquisition process. Following the MRI acquisition process(es), phase images of the anatomical region of interest are generated based on an acquired RF signal. These phase images may then be processed (e.g., using an inversion algorithm) to generate one or more quantitative images depicting stiffness of the anatomical region of interest. In some embodiments, a wave image is also generated showing propagation of the plurality of shear waves through the anatomical region of interest based on the phase images.

20 Claims, 6 Drawing Sheets

(56) References Cited

OTHER PUBLICATIONS

Moeller et al; "Multiband Multislice GE-EPI at 7 Tesla, With 16-fold Acceleration Using Partial Parallel Imaging With Application to High Spatial and Temporal Whole-Brain FMRI"; Magnetic Resonance in Medicine 63:1144-1153 (2009).
Setsompop et.al; "Blipped-Controlled Aliasing in Parallel Imaging for Simultaneous Multislice Echo Planar Imaging with Reduced g-Factor Penalty", Magnetic Resonance in Medicine 67:1210-1224 (2012).

* cited by examiner

METHOD OF MULTISLICE MR ELASTOGRAPHY WITH MULTIBAND ACQUISITION

TECHNICAL FIELD

The present invention relates generally to methods, systems, and apparatuses for combining multi-slice Magnetic Resonance (MR) elastography with multi-band acquisition techniques. The disclosed methods, systems, and apparatuses may be applied to, for example, to reduce the acquisition time associated with elastography applications.

BACKGROUND

Magnetic Resonance (MR) elastography depicts the relative stiffness of tissues by imaging the shear wave propagation generated by an external wave driver. The produced waveform is synchronized to a motion encoding gradient in the MR imaging sequence to encode tissue displacement as phase in the reconstructed images. The elastography technique has much clinical application including, for example, diagnosing various diseases of the liver. The MR imaging sequence used for liver MR Elastography is typically a gradient recalled echo sequence, which produces high quality images. However, this type of acquisition procedure is long and can only be acquired as a single slice during a twenty second breath-hold acquisition. The acquisition has to be repeated to acquire other slices on different positions of the liver. As a result, this procedure is time consuming and uncomfortable for the patient. Accordingly, it is desired to reduce the overall time required to perform MR Elastography acquisitions, without affecting the quality of the acquired images.

SUMMARY

Embodiments of the present invention address and overcome one or more of the above shortcomings and drawbacks, by methods, systems, and apparatuses for performing multi-slice Magnetic Resonance (MR) elastography using multi-band acquisition. This technology is particularly well-suited for, but by no means limited to, clinical applications such as diagnosis of various liver diseases.

According to some embodiments of the present invention, a method for performing multi-slice MR Elastography on an anatomical region of interest associated with a patient includes inducing shear waves at a shear wave frequency value (e.g., between 25-500 Hz) in the anatomical region of interest using an external driver. Next, the anatomical region of interest is imaged during a single patient breath-hold using a MRI acquisition process.

In some embodiments, the MRI acquisition process is performed by applying a multiband Radio Frequency (RF) pulse to the anatomical region of interest. This multiband RF pulse may be generated, for example, based on a user-selected multi-band acceleration factor. Next, one or more gradients are applied to the anatomical region of interest. For example, a slice selection gradient may be applied to the anatomical region of interest simultaneously with the multiband RF pulse. This slice selection gradient allows for the selection of tissue slice locations (e.g., interleaved slice locations) from the anatomical region of interest. In some embodiments, a motion encoding gradient is also applied to the anatomical region of interest. The motion encoding gradient may utilize a frequency value that is matched to the shear wave frequency value. Additionally, in some embodiments, an oscillating frequency encoding gradient is applied to the anatomical region of interest and the RF signal includes multiple echoes that are individually phase encoded allowing multiple k-space lines to be determined based on the multiband RF pulse. Once the RF pulses and gradients have been applied to the anatomical region of interest, an RF signal corresponding to the tissue slice locations is acquired in response.

In some embodiments, the aforementioned method further includes determining a user-selected desired number of slices that is a multiple of the user-selected multi-band acceleration factor. If the user-selected desired number of slices is greater than the user-selected multi-band acceleration factor, one or more additional MRI acquisition processes may be performed to acquire additional RF signals corresponding to one or more additional slice locations in the anatomical region of interest.

Following the MRI acquisition process(es), phase images of the anatomical region of interest are generated based on the RF signal. These phase images may then be processed (e.g., using an inversion algorithm) to generate one or more quantitative images depicting stiffness of the anatomical region of interest. In some embodiments, a wave image is also generated showing propagation of the shear waves through the anatomical region of interest based on the phase images.

One or more of the features described above may be implemented using various articles of manufacture, systems, or apparatuses. For example, in one embodiment, an article of manufacture for performing multi-slice MR Elastography on an anatomical region of interest associated with a patient includes a non-transitory, tangible computer-readable medium holding computer-executable instructions for performing one or more of the features discussed above with respect to the aforementioned method. According to other embodiments of the present invention, a system for performing multi-slice MR Elastography on an anatomical region of interest associated with a patient includes an external driver, a Magnetic Resonance (MR) imaging device, and an image data processor. The external driver is configured to induce shear waves at a shear wave frequency value in the anatomical region of interest. The external driver may include, for example and without limitation, an electromechanical driver, a piezoelectric stack driver, or an ultrasound transducer. The MR imaging device is configured to image the anatomical region of interest during a single patient breath-hold using one or more MRI acquisition processes that are similar to those discussed above with respect to the aforementioned method for performing multi-slice MR Elastography. The image data processor is configured to generate phase images of the anatomical region of interest based on the RF signal and process the phase images (e.g., using an inversion algorithm) to generate one or more quantitative images depicting stiffness of the anatomical region of interest.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

The following disclosure describes the present invention according to several embodiments directed at methods, systems, and apparatuses for utilizing multiband acquisition to achieve multi-slice Magnetic Resonance (MR) elastography. The various MR Elastography techniques described herein may be utilized for any motion encoding gradient in the slice, phase, and/or read direction. There are several clinical applications that will benefit from the techniques described herein including, without limitation, depiction of liver fibrosis in a single breath-hold period. Moreover, because the techniques described herein reduce the overall scan time required for acquisition, patient discomfort is reduced as the patient would receive less wave propagation than the conventional method.

Figure 1:
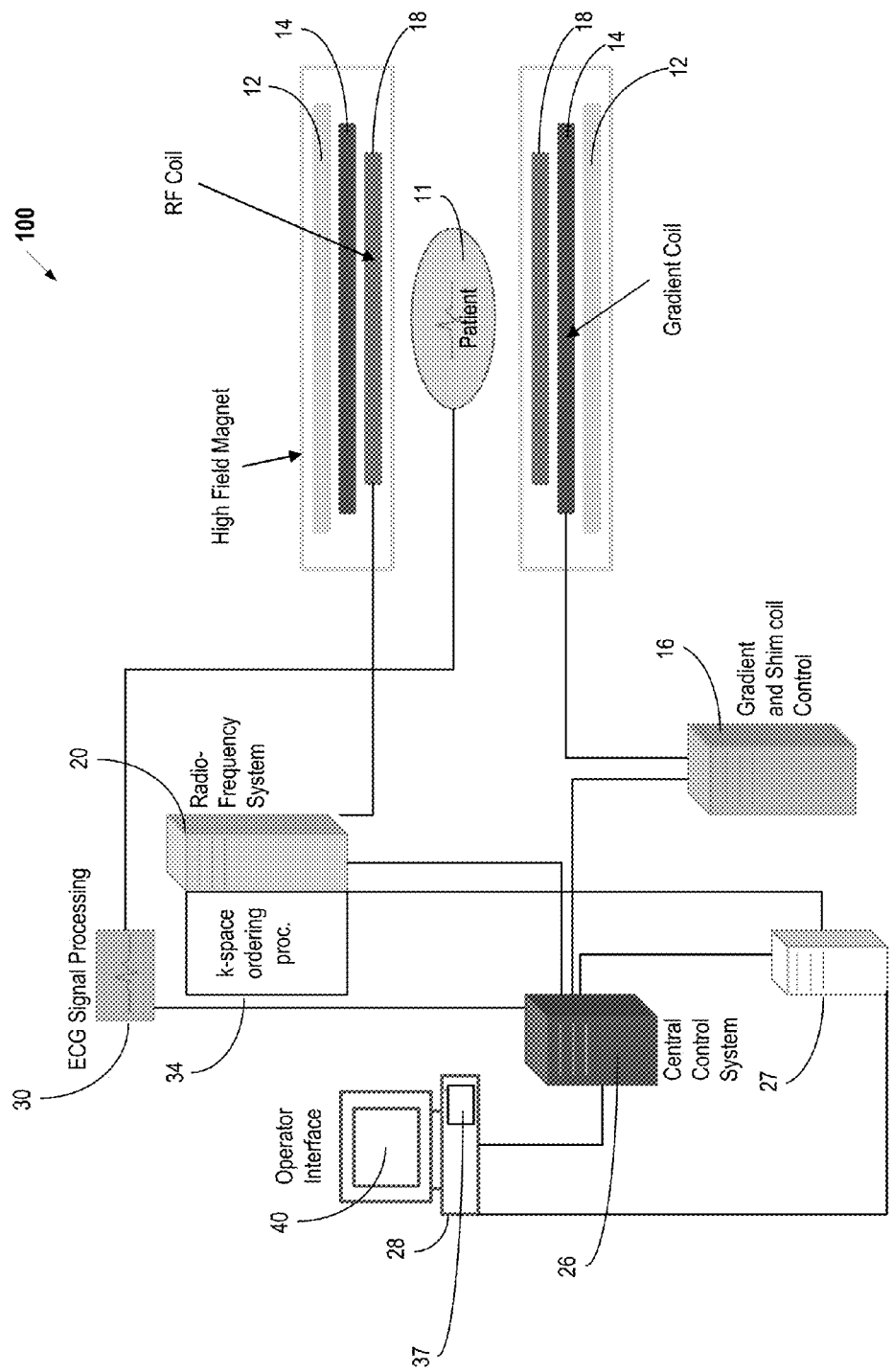
FIG. 1 shows system for ordering acquisition of frequency domain components representing MR image data for storage in a k-space storage array, according to some embodiments of the present invention.

FIG. 1 shows system 100 for ordering acquisition of frequency domain components representing MR image data for storage in a k-space storage array. In system 100, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further, Radio Frequency (RF) module 20 provides RF pulse signals to RF coil 18, which in response produces magnetic field pulses which rotate the spins of the protons in the patient 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and Magnetic Resonance signal detection, to acquire Magnetic Resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor. In some embodiments, the image data processor is located in central control unit 26, while in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements which each have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice (or slices) of the body and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central control unit 26 and enables user modification of Magnetic Resonance imaging signals in substantially real time. Display processor 37 processes the Magnetic Resonance signals to provide image representative data for display on display 40, for example.

Figure 2:
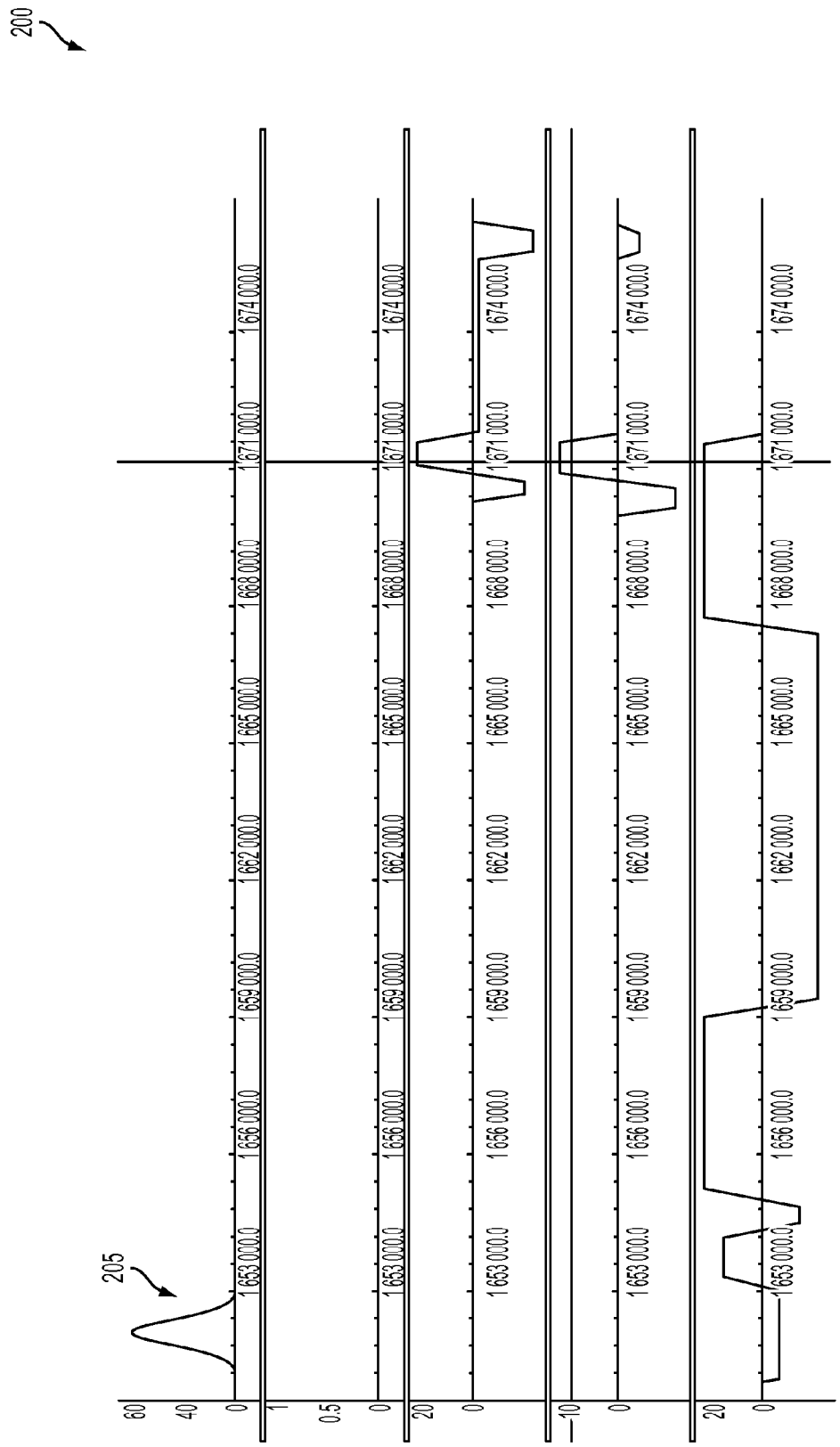
FIG. 2 provides a set of data charts illustrating a conventional implementation of the MR Elastography of the liver using a gradient echo sequence.

FIG. 2 provides a set of data charts 200 illustrating a conventional implementation of the MR Elastography of the liver using a gradient echo sequence. In this example, a regular sync RF pulse 205 is used for the acquisition. The motion encoding gradient is applied on the slice direction.

Notably, this acquisition can be long. For example, for liver applications, data can only be acquired as a single slice on a twenty second breath-hold. In this example, the long motion encoding gradient is applied on the slice direction. This acquisition has to be repeated for other slice positions until all areas are covered. This results in long scan time for the examination and causes patient discomfort as the patient has to receive repeated wave propagation generated by the external driver.

Using the techniques described herein, multi-slice acquisition with multiband RF pulse excitation may be used to speed up the total acquisition or improve the spatial coverage within a given repetition time. Multiband acquisition excites multiple slices at different off-resonance frequencies and subsequently separate aliased slices based on spatial sensitivity differences of RF receiver coils using parallel imaging techniques. According to some embodiments of the present invention, a multiband RF pulse replaces the conventional sync RF pulse for excitation while other gradients (including the motion encoding gradient direction) are similar to FIG. 2. This addresses the timing issues discussed above with reference to FIG. 2, because the multiband acquisition technique allows more data to acquire in a single breath-hold.

Figure 3:
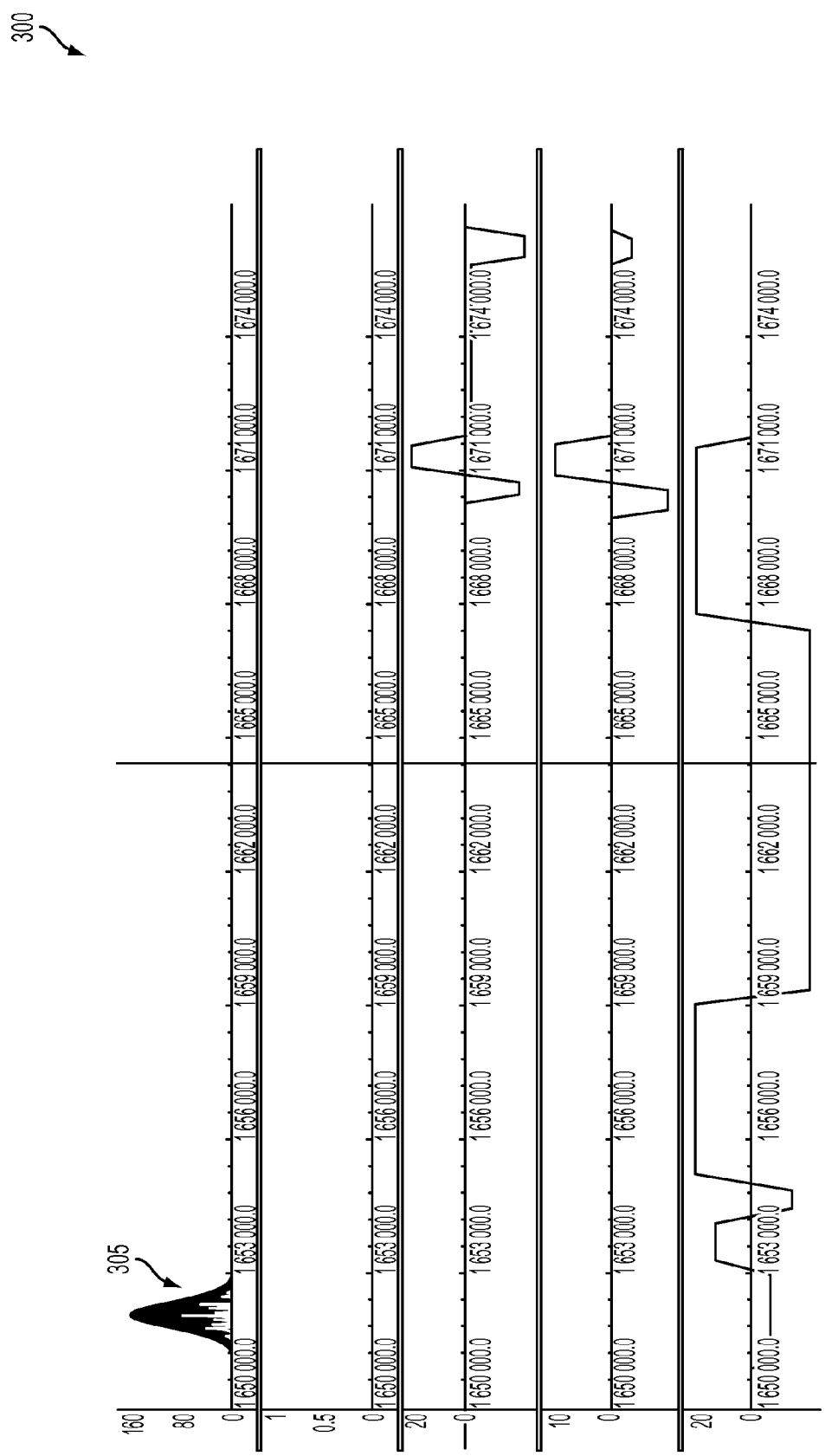
FIG. 3 illustrates a MR Elastography acquisition process which utilizes a multiband RF pulse to generate 5 slices used for the acquisition, where spins are simultaneously excited with corresponding RF frequencies, according to some embodiments of the present invention.
Figure 4:
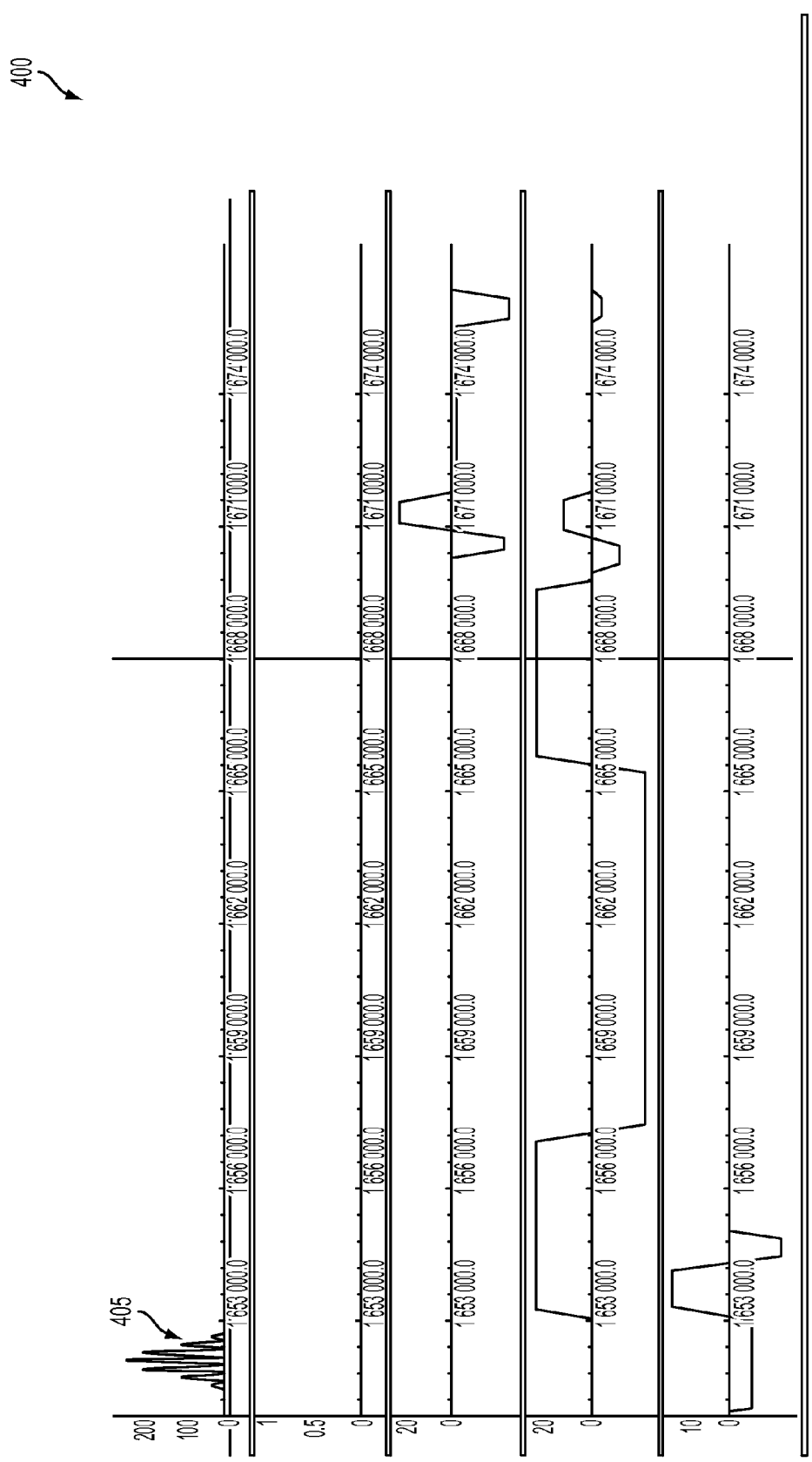
FIG. 4 illustrates multi-slice MR Elastography acquisition process using a multiband RF pulse that generates 3 slices, according to some embodiments of the present invention.

FIGS. 3 and 4 provide illustrations of combining multi-slice Magnetic Resonance (MR) elastography with multi-band acquisition techniques, according to some embodiments of the present invention. FIG. 3 illustrates a MR Elastography acquisition process 300 which utilizes a multiband RF pulse 305 to generate 5 slices used for the acquisition, where spins are simultaneously excited with corresponding RF frequencies. In some embodiments, the motion encoding gradient shown in FIG. 2 is still used in the slice direction in the example of FIG. 3. For liver applications, this acquisition process 300 allows MR Elastography of 5 slices in a single twenty second breath-hold. FIG. 4 illustrates multi-slice MR Elastography acquisition process 400 using a multiband RF pulse 405 that generate 3 slices. In the example of FIG. 4, the motion encoding gradient is used in the phase direction. This multiband RF implementation is robust and can be applied on any motion encoding gradient direction. For either of the processes 300, 400 illustrated in FIGS. 3 and 4, Magnetic Resonance Imaging (MRI) signals from multiple slices may be separated using a parallel imaging reconstruction technique that utilizes spatial encoding information from array RF receiver coils. It should be noted, various types of multiband RF pulses may be utilized in addition to those illustrated in FIGS. 3 and 4. Thus, in some embodiments, a specific multiband RF pulse can be selected to generate a desired number of slices. Additionally, multiple multiband RF pulses may be utilized in a sequence, with each pulse in the sequence exciting multiple slices of anatomy.

Figure 5:
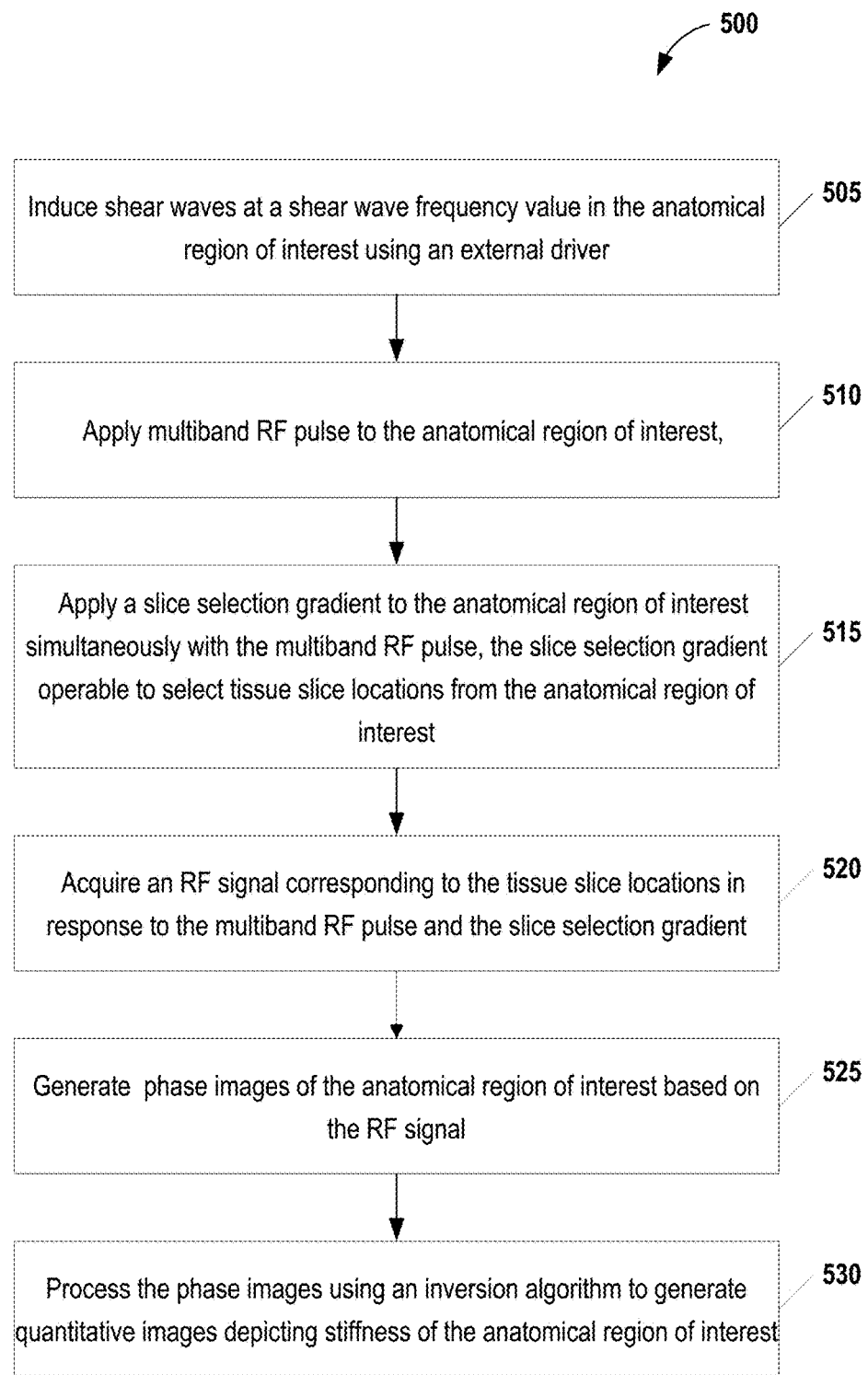
FIG. 5 illustrates a method for performing multi-slice MR Elastography on an anatomical region of interest associated with a patient, according to some embodiments of the present invention.

FIG. 5 illustrates a method 500 for performing multi-slice MR Elastography on an anatomical region of interest associated with a patient, according to some embodiments of the present invention. At 505, shear waves are induced at a shear wave frequency value in the anatomical region of interest using an external driver. The external driver may be, for example and without limitation, an electromechanical driver, a piezoelectric stack driver, or an ultrasound transducer. The shear wave frequency may be set depending on the clinical application and the goals of the study. For example, in one embodiment, the shear wave frequency value is between 25-500 Hz.

Once the shear wave has been induced in the anatomical region of interest, the region is imaged during a single patient breath-hold using a multi-band MRI acquisition process. Continuing with reference to FIG. 5, at 510 a multiband RF pulse is applied to the anatomical region of interest. In some embodiments, the multiband RF pulse is generated based on a user-selected multi-band acceleration factor. This multi-band acceleration factor may be specified, for example, prior to initiating the imaging sequence via entry into a graphical user interface providing control of the settings associated with the MRI imaging scanner. Next, at 515, a slice selection gradient is applied to the anatomical region of interest simultaneously with the multiband RF pulse. This slice selection gradient is operable to select tissue slice locations from the anatomical region of interest. In some embodiments, the tissue slice locations are acquired as interleaved slice locations. However, in other embodiments, different slice acquisition techniques may be employed. Additionally in some embodiments, a motion encoding gradient is applied to the anatomical region of interest. This motion encoding gradient may be associated with a frequency value which is matched to the shear wave frequency value. At 520, an RF signal corresponding to the plurality of tissue slice locations is acquired in response to the multiband RF pulse and the slice selection gradient applied to the anatomical region of interest. In some embodiments, an oscillating frequency encoding gradient may be applied to the anatomical region of interest. The acquired RF signal then includes multiple echoes that are individually phase encoded such that multiple k-space lines can be determined based the multiband RF pulse.

In some applications, the desired number of slices is greater than the user-selected multi-band acceleration factor. As a result, one or more additional MRI acquisition processes may be performed to acquire additional RF signals corresponding to additional slice locations in the anatomical region of interest. These additional acquisition processes may be performed in a manner similar to the first acquisition process described above with reference to steps 510-520 of FIG. 5, with adjustments made based on the change in slice location.

Continuing with reference to FIG. 5, at 525, one or more phase images of the anatomical region of interest are generated based on the RF signal. Then, at 530, these phase images are processed using an inversion algorithm to generate one or more quantitative images depicting stiffness of the anatomical region of interest. Additionally, in some embodiments, a wave image is also generated showing propagation of the shear waves through the anatomical region of interest based on the phase images. In some embodiments, an inline elastogram image may be calculated from the wave image to provide information about relative tissue stiffness. These images may be color coded such that a particular color indicates an area of high stiffness. Additionally, an elastogram image may be generated with a confidence mask which provides information about whether sheer wave stiffness values for a particular position in the image (e.g., voxel) are reliable.

Figure 6:
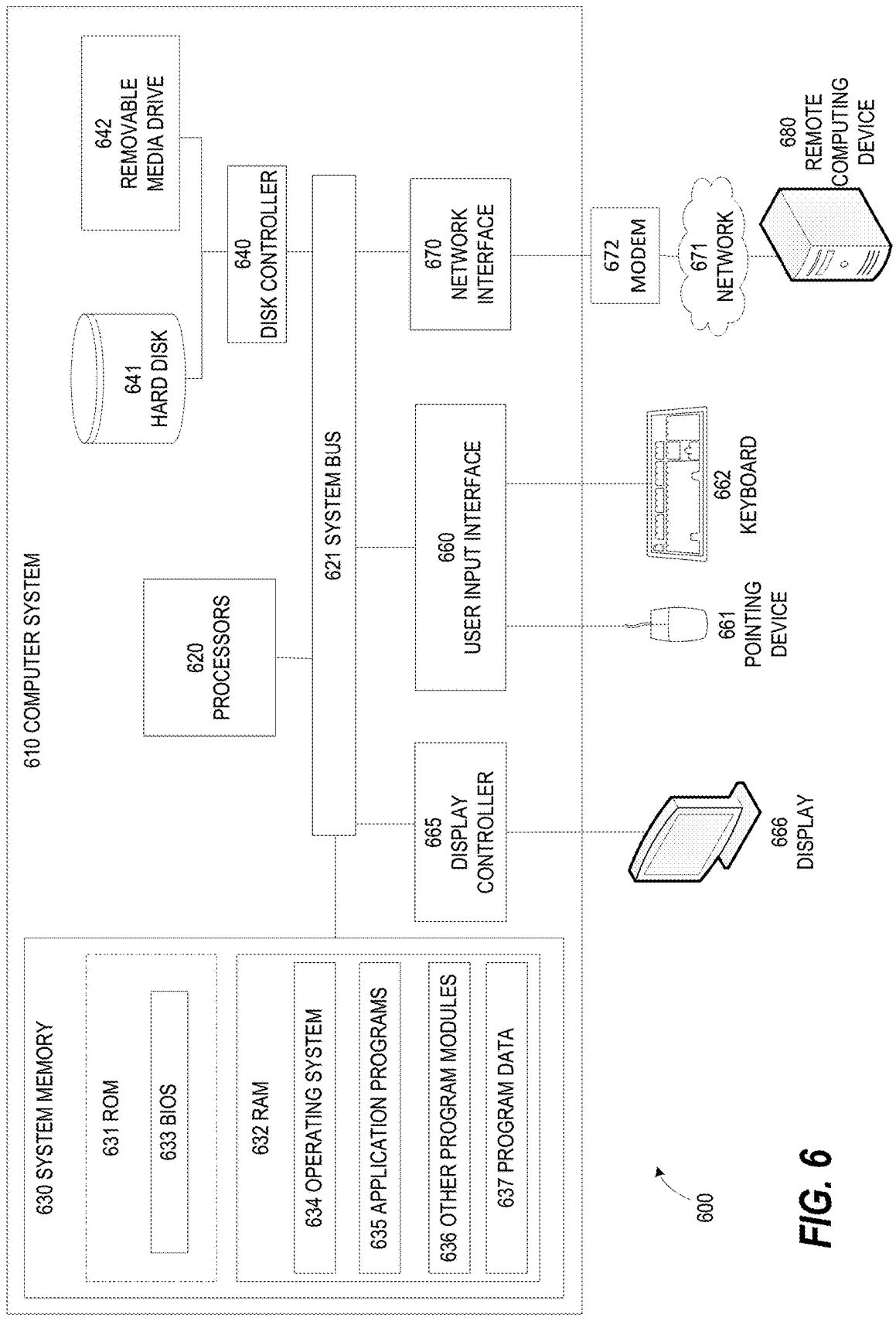
FIG. 6 illustrates an exemplary computing environment within which embodiments of the invention may be implemented.

FIG. 6 illustrates an exemplary computing environment 600 within which embodiments of the invention may be implemented. For example, computing environment 600 may be used to implement one or more components of system 100 shown in FIG. 1. Computers and computing environments, such as computer system 610 and computing environment 600, are known to those of skill in the art and thus are described briefly here.

As shown in FIG. 6, the computer system 610 may include a communication mechanism such as a system bus 621 or other communication mechanism for communicating information within the computer system 610. The computer system 610 further includes one or more processors 620 coupled with the system bus 621 for processing the information.

The processors 620 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 6, the computer system 610 also includes a system memory 630 coupled to the system bus 621 for storing information and instructions to be executed by processors 620. The system memory 630 may include computer readable storage media in the form of volatile and/or nonvolatile memory, such as read only memory (ROM) 631 and/or random access memory (RAM) 632. The RAM 632 may include other dynamic storage device(s) (e.g., dynamic RAM, static RAM, and synchronous DRAM). The ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in the ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the system bus 621 to control one or more storage devices for storing information and instructions, such as a magnetic hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the system bus 621 to control a display or monitor 666, such as a cathode ray tube (CRT) or liquid crystal display (LCD), for displaying information to a computer user. The computer system includes a user input interface 660 and one or more input devices, such as a keyboard 662 and a pointing device 661, for interacting with a computer user and providing information to the processors 620. The pointing device 661, for example, may be a mouse, a light pen, a trackball, or a pointing stick for communicating direction information and command selections to the processors 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a magnetic hard disk 641 or a removable media drive 642. The magnetic hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processors 620 for execution. A computer-readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 641 or removable media drive 642. Non-limiting examples of volatile media include dynamic memory, such as system memory 630. Non-limiting examples of transmission media include coaxial cables, copper wire, and fiber optics, including the wires that make up the system bus 621. Transmission media may also take the form of acoustic or light waves, such as those generated during radio wave and infrared data communications.

The computing environment 600 may further include the computer system 610 operating in a networked environment using logical connections to one or more remote computers, such as remote computing device 680. Remote computing device 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to system bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computing device 680). The network 671 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

A computer-executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A method for performing multi-slice MR Elastography on an anatomical region of interest associated with a patient, the method comprising:
   inducing a plurality of shear waves at a shear wave frequency value in the anatomical region of interest using an external driver;
   imaging the anatomical region of interest during a single patient breath-hold using a MRI acquisition process comprising:
      applying a multiband Radio Frequency (RF) pulse to the anatomical region of interest,
      applying a slice selection gradient to the anatomical region of interest simultaneously with the multiband RF pulse, the slice selection gradient operable to select a plurality of tissue slice locations from the anatomical region of interest,
      acquiring an RF signal corresponding to the plurality of tissue slice locations in response to the multiband RF pulse and the slice selection gradient;
   generating a plurality of phase images of the anatomical region of interest based on the RF signal; and
   processing the plurality of phase images using an inversion algorithm to generate one or more quantitative images depicting stiffness of the anatomical region of interest.

2. The method of claim 1, wherein the shear wave frequency value is between 25-500 Hz.

3. The method of claim 1, wherein the MRI acquisition process further comprises:
   applying a motion encoding gradient to the anatomical region of interest, wherein the motion encoding gradient is associated with a frequency value that is matched to the shear wave frequency value.

4. The method of claim 1, further comprising:
   generating a wave image showing propagation of the plurality of shear waves through the anatomical region of interest based on the plurality of phase images.

5. The method of claim 1, further comprising:
   generating the multiband RF pulse based on a user-selected multi-band acceleration factor.

6. The method of claim 5, further comprising:
   determining a user-selected desired number of slices that is a multiple of the user-selected multi-band acceleration factor;
   if the user-selected desired number of slices is greater than the user-selected multi-band acceleration factor, performing one or more additional MRI acquisition processes to acquire additional RF signals corresponding to one or more additional slice locations in the anatomical region of interest.

7. The method of claim 1, further comprising:
   applying an oscillating frequency encoding gradient to the anatomical region of interest, wherein the RF signal comprises multiple echoes that are individually phase encoded allowing multiple k-space lines to be determined based on the multiband RF pulse.

8. The method of claim 1, wherein the plurality of tissue slice locations comprise a plurality of interleaved slice locations.

9. An article of manufacture for performing multi-slice MR elastography on an anatomical region of interest associated with a patient, the article of manufacture comprising a non-transitory, tangible computer-readable medium holding computer-executable instructions for performing a method comprising:

inducing a plurality of shear waves at a shear wave frequency value in the anatomical region of interest using an external driver;

imaging the anatomical region of interest during a single patient breath-hold using an MRI acquisition process comprising:

applying a multiband Radio Frequency (RF) pulse to the anatomical region of interest, applying a slice selection gradient to the anatomical region of interest simultaneously with the multiband RF pulse, the slice selection gradient operable to select a plurality of tissue slice locations from the anatomical region of interest, acquiring an RF signal corresponding to the plurality of tissue slice locations in response to the multiband RF pulse and the slice selection gradient;

generating a plurality of phase images of the anatomical region of interest based on the RF signal; and processing the plurality of phase images using an inversion algorithm to generate one or more quantitative images depicting stiffness of the anatomical region of interest.

10. The article of manufacture of claim 9, wherein the shear wave frequency value is between 25-500 Hz.

11. The article of manufacture of claim 9, wherein the MRI acquisition process further comprises:

applying a motion encoding gradient to the anatomical region of interest, wherein the motion encoding gradient is associated with a frequency value that is matched to the shear wave frequency value.

12. The article of manufacture of claim 9, wherein the method further comprises:

generating a wave image showing propagation of the plurality of shear waves through the anatomical region of interest based on the plurality of phase images.

13. The article of manufacture of claim 9, wherein the method further comprises:

generating the multiband RF pulse based on a user-selected multi-band acceleration factor.

14. The article of manufacture of claim 13, wherein the method further comprises:

determining a user-selected desired number of slices that is a multiple of the user-selected multi-band acceleration factor;

if the user-selected desired number of slices is greater than the user-selected multi-band acceleration factor, performing one or more additional MRI acquisition processes to acquire additional RF signals corresponding to one or more additional slice locations in the anatomical region of interest.

15. The article of manufacture of claim 9, wherein the method further comprises:

applying an oscillating frequency encoding gradient to the anatomical region of interest, wherein the RF signal comprises multiple echoes that are individually phase encoded allowing multiple k-space lines to be determined based on the multiband RF pulse.

16. The article of manufacture of claim 9, wherein the plurality of tissue slice locations comprise a plurality of interleaved slice locations.

17. A system for performing multi-slice MR elastography on an anatomical region of interest associated with a patient, the system comprising:

an external driver configured to induce a plurality of shear waves at a shear wave frequency value in the anatomical region of interest;

a Magnetic Resonance (MR) imaging device configured to image the anatomical region of interest during a single patient breath-hold using an MRI acquisition process, the MRI acquisition process comprising:

applying a multiband Radio Frequency (RF) pulse to the anatomical region of interest, applying a slice selection gradient to the anatomical region of interest simultaneously with the multiband RF pulse, the slice selection gradient operable to select a plurality of tissue slice locations from the anatomical region of interest, and acquiring an RF signal corresponding to the plurality of tissue slice locations in response to the multiband RF pulse and the slice selection gradient;

an image data processor configured to:

generate a plurality of phase images of the anatomical region of interest based on the RF signal, and process the plurality of phase images using an inversion algorithm to generate one or more quantitative images depicting stiffness of the anatomical region of interest.

18. The system of claim 17, wherein the external driver is an electromechanical driver, a piezoelectric stack driver, or an ultrasound transducer.

19. The system of claim 17, wherein the MRI acquisition process further comprises:

applying a motion encoding gradient to the anatomical region of interest, wherein the motion encoding gradient is associated with a frequency value that is matched to the shear wave frequency value.

20. The system of claim 17, wherein the image data processor is further configured to:

generate a wave image showing propagation of the plurality of shear waves through the anatomical region of interest based on the plurality of phase images.

\* \* \* \* \*